United States Patent [19]
Sanada

[11] Patent Number: 5,483,488
[45] Date of Patent: Jan. 9, 1996

[54] SEMICONDUCTOR STATIC RANDOM ACCESS MEMORY DEVICE CAPABLE OF SIMULTANEOUSLY CARRYING DISTURB TEST IN A PLURALITY OF MEMORY CELL BLOCKS

[75] Inventor: Kohji Sanada, Tokyo, Japan

[73] Assignee: NEC Corporation, Tokyo, Japan

[21] Appl. No.: 310,335

[22] Filed: Sep. 22, 1994

[30] Foreign Application Priority Data

Sep. 24, 1993 [JP] Japan .................................. 5-261858

[51] Int. Cl.$^6$ .............................................. G11C 11/418
[52] U.S. Cl. ............................ 365/189.03; 365/230.03; 365/201; 365/189.08; 365/230.06; 371/21.1
[58] Field of Search ...................... 365/230.03, 189.03, 365/201, 230.08, 189.08, 230.06; 371/21.1

[56] References Cited

U.S. PATENT DOCUMENTS

| | | | |
|---|---|---|---|
| 4,873,669 | 10/1989 | Furutani et al. | 365/189.01 |
| 5,276,647 | 1/1994 | Matsui et al. | 365/201 |
| 5,355,342 | 10/1994 | Ueoka | 365/201 |

FOREIGN PATENT DOCUMENTS

| | | |
|---|---|---|
| 61-237300 | 10/1986 | Japan . |
| 62-46499 | 2/1987 | Japan . |
| 62-198147 | 9/1987 | Japan . |
| 1232600 | 9/1989 | Japan . |
| 2113499 | 4/1990 | Japan . |
| 294100 | 4/1990 | Japan . |

*Primary Examiner*—David C. Nelms
*Assistant Examiner*—Andrew Q. Tran
*Attorney, Agent, or Firm*—Sughrue, Mion, Zinn, Macpeak & Seas

[57] ABSTRACT

A semiconductor static random access memory device is subjected to a disturb test before delivery to a customer so as to guarantee data retaining capability of memory cells, and a mode signal higher than a standard voltage range causes a block address decoder unit to concurrently activate a plurality of row address decoder units so that the disturb test is simultaneously carried out for the plurality of memory cell blocks, thereby shrinking time period for the disturb test.

6 Claims, 8 Drawing Sheets

| TEST SEQUENCE | BLOCK ADDRESS & ROW ADDRESS | | | | | | | |
|---|---|---|---|---|---|---|---|---|
| | TRUE | | | | COMPLEMENT | | | |
| FIRST | AX3<br>AX2<br>AX1<br>AX0 | AX3<br>AX2<br>$\overline{AX1}$<br>AX0 | AX3<br>AX2<br>AX1<br>$\overline{AX0}$ | AX3<br>AX2<br>$\overline{AX1}$<br>$\overline{AX0}$ | $\overline{AX3}$<br>$\overline{AX2}$<br>$\overline{AX1}$<br>$\overline{AX0}$ | $\overline{AX3}$<br>$\overline{AX2}$<br>$\overline{AX1}$<br>$\overline{AX0}$ | $\overline{AX3}$<br>$\overline{AX2}$<br>$\overline{AX1}$<br>$\overline{AX0}$ | $\overline{AX3}$<br>$\overline{AX2}$<br>AX1<br>$\overline{AX0}$ |
| SECOND | $\overline{AX3}$<br>AX2<br>AX1<br>AX0 | $\overline{AX3}$<br>AX2<br>$\overline{AX1}$<br>AX0 | $\overline{AX3}$<br>AX2<br>AX1<br>$\overline{AX0}$ | $\overline{AX3}$<br>AX2<br>$\overline{AX1}$<br>$\overline{AX0}$ | AX3<br>$\overline{AX2}$<br>$\overline{AX1}$<br>$\overline{AX0}$ | AX3<br>$\overline{AX2}$<br>$\overline{AX1}$<br>$\overline{AX0}$ | AX3<br>$\overline{AX2}$<br>$\overline{AX1}$<br>$\overline{AX0}$ | AX3<br>$\overline{AX2}$<br>AX1<br>$\overline{AX0}$ |

Fig. 12

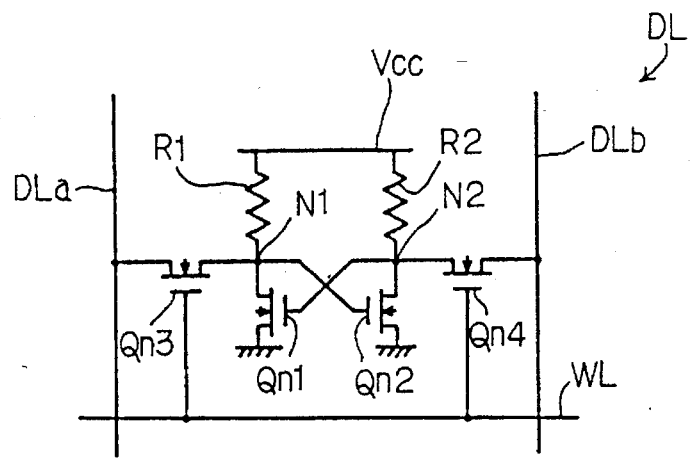

Fig. 2
PRIOR ART

| TEST SEQUENCE | ROW ADDRESS | | TEST SEQUENCE | ROW ADDRESS | |
|---|---|---|---|---|---|
| | TRUE | COMPLEMENTARY | | TRUE | COMPLEMENTARY |
| FIRST | AX3<br>AX2<br>AX1<br>AX0 | $\overline{AX3}$<br>$\overline{AX2}$<br>$\overline{AX1}$<br>$\overline{AX0}$ | FIFTH | AX3<br>AX2<br>AX1<br>$\overline{AX0}$ | $\overline{AX3}$<br>$\overline{AX2}$<br>$\overline{AX1}$<br>AX0 |
| SECOND | $\overline{AX3}$<br>AX2<br>AX1<br>AX0 | AX3<br>$\overline{AX2}$<br>$\overline{AX1}$<br>$\overline{AX0}$ | SIXTH | $\overline{AX3}$<br>$\overline{AX2}$<br>AX1<br>AX0 | AX3<br>AX2<br>$\overline{AX1}$<br>$\overline{AX0}$ |
| THIRD | AX3<br>$\overline{AX2}$<br>AX1<br>AX0 | $\overline{AX3}$<br>AX2<br>$\overline{AX1}$<br>$\overline{AX0}$ | SEVENTH | $\overline{AX3}$<br>$\overline{AX2}$<br>AX1<br>AX0 | AX3<br>$\overline{AX2}$<br>AX1<br>$\overline{AX0}$ |
| FOURTH | AX3<br>AX2<br>$\overline{AX1}$<br>AX0 | $\overline{AX3}$<br>$\overline{AX2}$<br>AX1<br>$\overline{AX0}$ | EIGHTH | $\overline{AX3}$<br>AX2<br>AX1<br>$\overline{AX0}$ | AX3<br>$\overline{AX2}$<br>$\overline{AX1}$<br>AX0 |

Fig. 5
PRIOR ART

| TEST SEQUENCE | BLOCK ADDRESS & ROW ADDRESS | | | |
|---|---|---|---|---|
| | TRUE | | COMPLEMENT | |
| FIRST | AX3<br>AX2<br>AX1<br>AX0 | AX3<br>AX2<br>AX1<br>$\overline{AX0}$ | $\overline{AX3}$<br>$\overline{AX2}$<br>$\overline{AX1}$<br>AX0 | $\overline{AX3}$<br>$\overline{AX2}$<br>$\overline{AX1}$<br>AX0 |
| SECOND | $\overline{AX3}$<br>AX2<br>AX1<br>AX0 | $\overline{AX3}$<br>AX2<br>AX1<br>$\overline{AX0}$ | AX3<br>$\overline{AX2}$<br>$\overline{AX1}$<br>$\overline{AX0}$ | AX3<br>$\overline{AX2}$<br>$\overline{AX1}$<br>AX0 |
| THIRD | AX3<br>AX2<br>$\overline{AX1}$<br>$\overline{AX0}$ | AX3<br>AX2<br>$\overline{AX1}$<br>AX0 | $\overline{AX3}$<br>$\overline{AX2}$<br>AX1<br>AX0 | $\overline{AX3}$<br>$\overline{AX2}$<br>AX1<br>$\overline{AX0}$ |
| FOURTH | $\overline{AX3}$<br>AX2<br>$\overline{AX1}$<br>$\overline{AX0}$ | $\overline{AX3}$<br>AX2<br>$\overline{AX1}$<br>AX0 | AX3<br>$\overline{AX2}$<br>AX1<br>AX0 | AX3<br>$\overline{AX2}$<br>AX1<br>$\overline{AX0}$ |

Fig. 9

SEMICONDUCTOR STATIC RANDOM ACCESS MEMORY DEVICE CAPABLE OF SIMULTANEOUSLY CARRYING DISTURB TEST IN A PLURALITY OF MEMORY CELL BLOCKS

FIELD OF THE INVENTION

This invention relates to a semiconductor static random access memory device and, more particularly, to a semiconductor static random access memory device completing a disturb test within short time period.

DESCRIPTION OF THE RELATED ART

A typical example of the semiconductor static random access memory device is illustrated in FIG. 1 of the drawings, and comprises a memory cell array 1 implemented by a plurality of static memory cells arranged in rows and columns. The static memory cells are represented by small circles in FIG. 1.

A plurality of word lines WL0 to WLm are respectively associated with the rows of static memory cells, and selects one of the row of static memory cells in a read-out sequence or a write-in sequence. A plurality of digit line pairs DL0 to DLn are respectively associated with the columns of static memory cells, and propagate data bits in the form of potential difference to and from the selected row of static memory cells.

Each of the static memory cells is similar in circuit configuration to a memory circuit shown in FIG. 2, and comprises two series combinations of resistors R1/R2, memory nodes N1/N2 and n-channel enhancement type switching transistors Qn1/Qn2 coupled between a power voltage line Vcc and a ground voltage line and two n-channel enhancement type switching transistors Qn3 and Qn4 coupled between digit lines DLa and DLb of the associated digit line pair DL. The n-channel enhancement type switching transistors Qn3 and Qn4 are gated by the associated word line WL, and the gate electrodes of the n-channel enhancement type switching transistors Qn1 and Qn2 are coupled to the memory nodes N2 and N1, respectively.

A data bit is stored in the static memory cell in the form of potential difference between the memory nodes N1 and N2, and the n-channel enhancement type switching transistors Qn1 and Qn2 are turned on and off for keeping the potential difference.

When the word line WL is energized to a high voltage level, the n-channel enhancement type switching transistors Qn3 and Qn4 concurrently turn on, and the digit lines DLa and DLb are coupled to the memory nodes N1 and N2, respectively. In the write-in sequence, the potential difference between the digit lines DLa and DLb is transferred through the n-channel enhancement type switching transistors Qn3 and Qn4 to the memory nodes N1 and N2, and is stored in the static memory cell in the form of the potential difference between the memory nodes N1 and N2. On the other hand, the potential deference is transferred from the memory nodes N1 and N2 through the n-channel enhancement type switching transistors Qn3 and Qn4 to the digit lines DLa and DLb already equalized in the read-out sequence, and produces the potential difference between the digit lines DLa and DLb.

Turning back to FIG. 1 of the drawings, the prior art static random access memory device further comprises a row address buffer unit 2 coupled to row address pins AX0 to AXi and a row address decoder unit 3 coupled between the row address buffer unit 2 and the word lines WL0 to WLm. The row address buffer unit 2 temporarily stores row address bits, and produces row address predecoded signals. The row address predecoded signals are supplied to the row address decoder unit 3, and the row address decoder unit 3 is responsive to the row address predecoded signals for energizing one of the word lines WL0 to WLm. Thus, one of the rows of static memory cells is selected on the basis of the row address bits supplied to the row address pins AX0 to AXi.

The memory cell array 1 is split into a plurality of memory cell sub-arrays, and parts of the row address bits are used for selecting one of the memory cell sub-arrays in the read-out/write-in sequences. Only one memory cell sub-arrays is activated in both standard and testing modes.

The prior art static random access memory device further comprises a column address buffer unit 4 coupled to column address pins AY0 to AYj, a column address decoder unit 5 coupled to the column address buffer unit 4 and a sense amplifiers/column selector unit 6 coupled between the digit line pairs DL0 to DLn and a data bus BS. Column address bits are transferred from the column address pins AY0 to AYj to the column address decoder unit 5, and the column address buffer unit 4 temporarily stores the column address bits for predecoding. The column address predecoded signals are transferred from the column address buffer unit 4 to the column address decoder unit 5, and the column address decoder unit 5 causes the sense amplifiers/column selector unit 6 to couple four digit line pairs to the data bus BS with column address decoded signals. Thus, the row address buffer unit 2, the row address decoder unit 3 and the word lines WL0 to WLm cooperate with the column address buffer unit 4, the column address decoder unit 5, the sense amplifiers/column selector unit 6 and the digit line pairs DL0 to DLn for selecting four static memory cells from the memory cell array 1.

The prior art static random access memory device further comprises a data output unit 7 coupled between the data bus BS and four data pins I/O1 to I/O4, a data input unit 8 coupled to the data pins I/O1 to I/O4 and three signal buffer units 9a, 9b and 9c respectively assigned to a chip select signal CS, an output enable signal OE and a write enable signal WE.

The chip select signal CS of an active low level is stored in the buffer unit 9a, and the buffer unit 9a produces a first enable signal EBL1 from the chip select signal CS. The first enable signal EBL1 is supplied to the row address buffer unit 2, the column address buffer unit 4 and the buffer units 9b and 9c, and enables these units 2, 4, 9b and 9c.

The output enable signal OE of the active low level is stored in the buffer unit 9b, and the buffer unit 9b produces a second enable signal EBL2 from the output enable signal OE. The output enable signal OE is changed to the active low level in the read-out sequence, and the second enable signal EBL2 enables the data output unit 7. Then, the data output unit 7 produces a four-bit output data signal from the potential differences on the data bus, and supplies the four-bit output data signal to the data pins I/O1 to I/O4.

The write enable signal WE is changed to the active low level in the write-in sequence, and the buffer unit 9c produces a third enable signal EBL3 from the write enable signal WE. The third enable signal EBL3 is supplied to the data input unit 8, and enables the data input unit 8. The data input unit 8 enabled with the third enable signal EBL3 produces four potential differences from the four-bit input data signal, and the four potential differences are supplied to the data bus BS.

Thus, while the prior art static random access memory device is operating in the read-out sequence, the four data bits are transferred from the memory cell array 1 to the data bus BS in the form of potential difference, and the four-bit output data signal indicative of the four read-out data bits is delivered through the data output unit 7 to the four data pins I/O1 to I/O4. On the other hand, if the prior art static random access memory device is carrying out the write-in sequence, the data input unit 8 converts the four-bit input data signal into four potential differences, and the four potential differences are propagated through the selected four digit line pairs to the selected static memory cells for storing therein.

The prior art static random access memory device is subjected to various tests before delivery to a customer, and one of the tests is known as a disturb test.

As described hereinbefore, the static memory cell stores a data bit in the form of potential difference between the memory nodes N1 and N2, and the memory nodes N1 and N2 are selectively coupled through the resistor R1 or R2 to the power voltage line Vcc and through the n-channel enhancement type switching transistors Qn1 or Qn2 to the ground voltage line for keeping the potential difference. Each of the resistors R1 and R2 is several tera-ohms, and each of the n-channel enhancement type switching transistors Qn1 and Qn2 provides several hundreds ohms in the on-state. For this reason, while the n-channel enhancement type switching transistors Qn3 and Qn4 are isolating the memory nodes N1 and N2 from the digit lines DLa and DLb, the memory node N1 is, by way of example, maintained at the positive power voltage level Vcc, and the other memory node N2 is approximately equal to the ground voltage level.

When the prior art static random access memory device starts the read-out sequence, the digit lines DLa and DLb are initially equalized at the positive power voltage level Vcc, and the n-channel enhancement type switching transistors Qn3 and Qn4 transfers the positive power voltage level Vcc to the memory nodes N1 and N2 upon selection of the word line WL. If the memory node N2 exceeds the threshold of the n-channel enhancement type switching transistor Qn1, the n-channel enhancement type switching transistor turns on, and pulls down the positive power voltage level Vcc at the memory node N1. In order to prevent the potential difference between the memory nodes N1 and N2 from undesirable inversion, the manufacturer designs the n-channel enhancement type switching transistors Qn3/Qn4 and the n-channel enhancement type switching transistors Qn1/Qn2 to have a large ratio in on-resistance, and the undesirable inversion hardly takes place in so far as the n-channel enhancement type switching transistors Qn1/Qn2/Qn3/Qn4 fall within the designed ratio.

However, a fluctuation in the fabrication process undesirably changes the ratio between the n-channel enhancement type switching transistors Qn1/Qn2 and the n-channel enhancement type switching transistors Qn3/Qn4, and the disturb test aims at screening defective products containing the static memory cells out of the design ratio.

In the disturb test, each word line is repeatedly energized before the recovery of the memory node to the positive power voltage level Vcc. Since the resistor R1 or R2 is several tera-ohms, the recovery is relatively slow rather than the decay from the positive power voltage level Vcc, and repetition is expected to actualize the defective memory cell by inverting the potential difference.

FIG. 3 illustrates the disturb test sequence. First, the prior art static random access memory device is coupled to a diagnostic system (not shown), and the cycle time for energizing each word line is shorter than a read cycle time Trc guaranteed by the manufacturer as shown in FIG. 4. The row address bits area changed between a row address A and the complementary row address CA, and the address change between the row address A and the complementary row address CA is called as "address modulation". The address modulation allows the diagnostic system to alternatively check the word line assigned the row address A and the word line assigned the complementary row address CA to see whether or not a defective static memory cell is coupled thereto. The row address change is variable, because the activation timing of the word line is not constant between the products. Therefore, if the disturb test is carried out at a fixed timing, a defective memory cell may not be actualized. The column address is not provided to the static random access memory device in the disturb test.

Turning back to FIG. 3, the diagnostic system writes value "0" into a flag F assigned to an internal register thereof as by step S1, and repeats the write-in sequence for writing a test bit into all of the static memory cells of the memory cell array 1 as by step S2.

The diagnostic system proceeds to step S3, and increments the row address. The diagnostic system supplies the row address of "0" in the first execution at step S3, and sequentially increments the row address at step S3 after the first execution.

The diagnostic system proceeds to step S4, and the static memory cells assigned the selected row address are subjected to the disturb test n times. In detail, the diagnostic system causes the row address decoder unit 3 to energize the word line WL0 assigned the row address "0" and to maintain a time period Ta (see FIG. 4). When the time period Ta is expired, the diagnostic system causes the row address decoder unit 3 to change the selected word line from WL0 to WLm assigned the complementary row address of the row address "0" and to maintain the word line WLm at the high voltage level for a time period (TrC-Ta). The diagnostic system changes the row address to zero again, and causes the row address decoder unit B to energize the word line WL0 and to keep the word line WL0 at the high voltage level for a time period Tb (see FIG. 4). Thereafter, the diagnostic system causes the row address decoder unit 3 to change the selected word line from WL0 to WLm, and carries out the disturb test for a time period (Trc-Tb). In this way, the diagnostic system sequentially changes the time periods, and repeats the disturb test on the word lines WL0 and WLm n times.

When the disturb test on the word lines WL0 and WLm is completed, the diagnostic system proceeds to step S5 to see whether or not all the word lines WL0 to WLm have been already subjected to the disturb test.

While the answer at step S5 is given negative, the diagnostic system returns to step S3, and reiterates the loop consisting of steps S3 to S5.

When the diagnostic system carried out the disturb test on all of the word lines WL0 to WLm, the answer at step S5 is changed to "Yes", and the diagnostic system sequentially reads out the test bits from all of the static memory cells as by step S6. The diagnostic system compares the read-out test bits with the write-in test bits, and checks the read-out test bits to see whether or not undesirable inversion takes place. If the inversion takes place, the static random access memory device is defective.

On the other hand, if no inversion takes place, the diagnostic system checks the flag F whether to be zero or not as by step S7. If the answer at step S7 is given affirmative, the diagnostic system proceeds to step S8, and writes a test bit of the opposite logic level to all of the static memory cells. Subsequently, the diagnostic system changes the flag to one as by step S9, and repeats the loop consisting of steps S3 to S5.

After the disturb test on all of the word lines WL0 to WLm, the diagnostic system sequentially reads out the test bits from all of the static memory cells to see whether or not undesirable inversion takes place. If the inversion takes place, the product is defective. On the other hand, if all of the read-out test bits are matched with the write-in test bits, the diagnostic system checks the flag F whether to be zero or not at step S7 again.

Since the flag F was changed to one at step S9, the answer at step S7 is given negative, and the diagnostic system confirms that both memory nodes N1 and N2 of each static memory cell are excellent for retaining data information. Then, the diagnostic system diagnoses that the manufacturer can guarantee the static random access memory device, and terminates the test sequence.

In this instance, the row address bits are i, and the row addresses are $2^{i+1}$, and the disturb test sequence shown in FIG. 3 is repeated $2^{i+1}/2$ times. For example, if i is 3, the diagnostic system needs to repeat the disturb test sequence eight times as shown in FIG. 5, and over-line is indicative of the complementary bit strings of a given bit strings.

The static random access memory device progressively increases the integration density and, accordingly, the row addresses. On the other hand, the circuit components R1/R2 and Q1/Q2/Q3/Q4 are miniaturized, and are much liable to be affected by the fluctuation of the process sequence. This results in that the diagnostic system consumes a prolonged time period for the disturb test, and the prolonged time period increases the cost of the static random access memory device.

SUMMARY OF THE INVENTION

It is therefore an important object of the present invention to provide a static random access memory device which completes a disturb test within short time period.

To accomplish the object, the present invention proposes to concurrently subject a plurality of memory cell sub-arrays to the disturb test by activating associated row address decoder units.

In accordance with the present invention, there is provided a semiconductor static random access memory device having a standard mode and a testing mode, comprising: a) a memory cell array split into a plurality of memory cell sub-arrays each implemented by a plurality of addressable memory cells; b) a plurality of sets of word lines respectively associated with said plurality of memory cell sub-arrays, the word lines of each set being selectively coupled to said addressable memory cells of the associated memory cell sub-array for making selected memory cells accessible; c) a plurality of sets of digit line pairs respectively associated with said plurality of memory cell sub-arrays, the digit line pairs of each set being selectively coupled to said memory cells of the associated memory cell sub-array for propagating data bits from and to the selected memory cells; d) a plurality of row address decoder units respectively associated with said plurality of sets of word lines, and each responsive to a first enable signal for energizing one of the word lines of the associated set specified by external row address bits; e) a controlling means responsive to an external control signal in first state indicative of said testing mode for producing a second enable signal; f) a block address decoder unit responsive to external block address bits for supplying said first enable signal to one of said plurality of row address decoder units in said standard mode; and g) a multiple selecting circuit enabled with said second enable signal, and operative to cause said block decoder to supply said first enable signal to more than one row address decoder units in said testing mode.

BRIEF DESCRIPTION OF THE DRAWINGS

The features and advantages of the static random access memory device according to the present invention will be more clearly understood from the following description taken in conjunction with the accompanying drawings in which:

FIG. 2 is a circuit diagram showing the configuration of the static memory cell;

FIG. 5 is a view showing the relation between the block and row addresses and the repeated testing sequence;

FIG. 9 is a view showing a relation between the block and row addresses and the address modulation in the disturb test sequence;

FIG. 12 is a view showing a relation between the block and row addresses and the address modulation in the disturb test sequence.

DESCRIPTION OF THE PREFERRED EMBODIMENTS

First Embodiment

Figure 6:
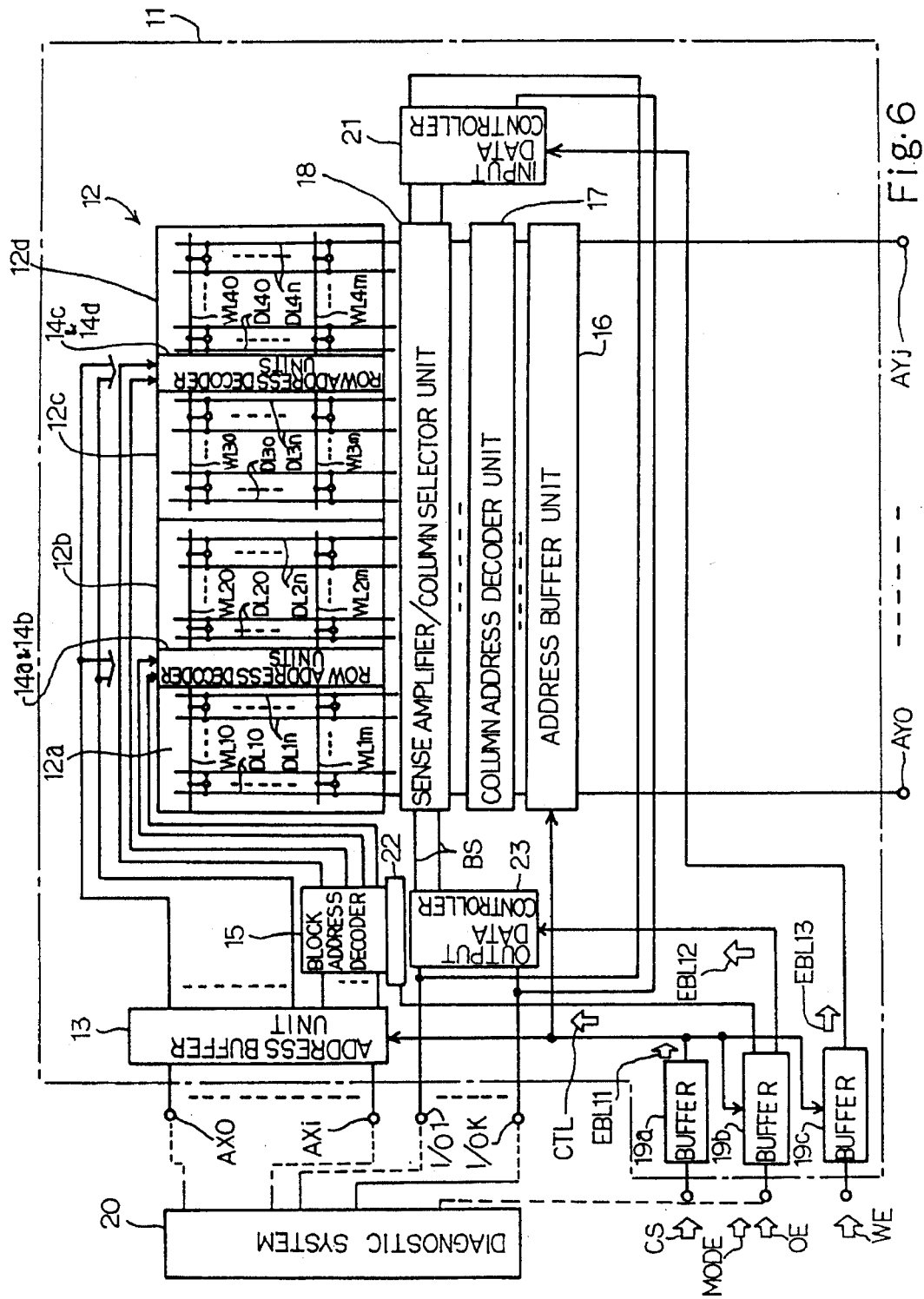
FIG. 6 is a block diagram showing the arrangement of the a static random access memory device according to the present invention.

Referring to FIG. 6 of the drawings, a semiconductor static random access memory device embodying the present invention is fabricated on a semiconductor chip 11. The semiconductor static random access memory device selectively enters into a standard mode for writing and reading data bits and a testing mode for inspections before delivery to a customer.

The semiconductor static random access memory device comprises a memory cell array 12 split into four memory cell sub-arrays 12a, 12b, 12c and 12d, and each of the memory cell sub-arrays 12a to 12d is implemented by a plurality of static memory cells respectively represented by small circles. The plurality of static memory cells of each memory cell sub-array 12a, 12b, 12c or 12d are arranged in rows and columns. The circuit configuration of the static memory cells is similar to that of the prior art static memory cells shown in FIG. 2, and no description is incorporated hereinbelow for the sake of simplicity. When description refers to the components of the static random access memory cell, the references used in FIG. 2 identify the components.

The semiconductor static random access memory device further comprises a plurality of sets of word lines WL10-WL1m, WL20-WL2m, WL30-WL3m and WL40-WL4m respectively associated with the memory cell sub-arrays 12a to 12d. The word lines of each set WL10-WL1m, WL20-WL2m, WL30-WL3m or WL40-WL4m are coupled to the gate electrodes of the n-channel enhancement type switching transistors Qn3 and Qn4 of the respective rows of memory cells incorporated in the associated memory cell sub-array. The memory cell sub-arrays 12a to 12d are respectively assigned block addresses, and row addresses are respectively assigned to the word lines of each set WL10-WL1m, WL20-WL2m, WL30-WL3m and WL40-WL4m.

The semiconductor static random access memory device further comprises a plurality of sets of digit line pairs DL10-DL1n, DL20-DL2n, DL30-DL3n and DL40-DL4n respectively associated with the memory cell sub-arrays 12a to 12d. The digit line pairs of each set DL10-DL1n, DL20-DL2n, DL30-DL3n or DL40-DL4n are coupled to the drain nodes of the n-channel enhancement type switching transistors Qn3 and Qn4 in the respective columns of static memory cells. When one of the word lines is energized, the n-channel enhancement type switching transistors Qn3 and Qn4 coupled thereto turn on, and the memory nodes N1 and N2 of the static memory cells are coupled through the n-channel enhancement type switching transistors Qn3 and Qn4 to the associated digit line pairs, respectively.

In this instance, every k digit line pairs of each set DL10-DL1n, DL20-DL2n, DL30-DL3n or DL40-DL4n are grouped, and a column address is assigned to each digit line pair group.

The semiconductor static random access memory device further comprises an address buffer unit 13 coupled to address pins AX0 to AXi, four row address decoder units 14a, 14b, 14c and 14d and a block address decoder unit 15, and external address bits supplied to the address pins AX0 to AXi are indicative of one of the block addresses and one of the row addresses. The address buffer unit 13 produces row address predecoded signals and block address predecoded signals from the external address bits at the address pins AX0 to AXi.

The external address bits AX0 and AX1 are indicative of the selected block address, and the block address decoder unit 15 is responsive to the block address predecoded signals AX0, CAX0, AX1 and CAX1 in the standard mode for changing one of the block address decoded signals BL1, BL2, BL3 and BL4 to an active level. The block address decoded signals BL1 to BL4 of the active level serves as a first enable signal.

Figure 7:
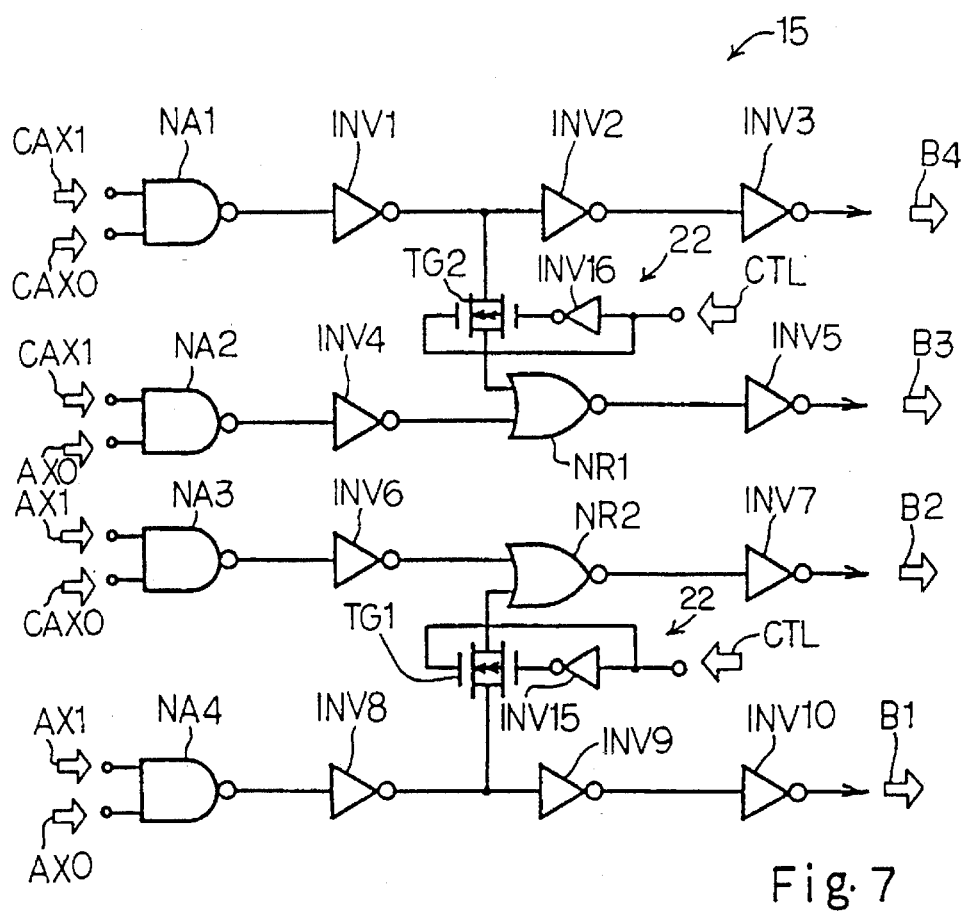
FIG. 7 is a logic diagram showing a block address decoder unit and a multiple selecting circuit incorporated in the semiconductor static random access memory device.

Turning to FIG. 7 of the drawings, the block address decoder unit 15 is illustrated in detail, and comprises a first series combination of a NAND gate NA1 and inverters INV1, INV2 and INV3, a second series combination of a NAND gate NA2, an inverter INV4, a NOR gate NR1 and an inverter INV5, a third series combination of a NAND gate NA3, an inverter INV6, a NOR gate NR2 and an inverter INV7 and a fourth series combination of a NAND gate NA4 and inverters INV8, INV9 and INV10. The block address predecoded signals AX0, CAX0, AX1 and CAX1 are selectively supplied to the NAND gates NA1 to NA4, and cause one of the inverters INV3, INV5, INV7 and INV10 to change the block address decoded signal B1, B2, B3 or B4 to the active high level.

Turning back to FIG. 6, the row address decoder units 14a to 14d are respectively associated with the sets of word lines WL10-WL1m, WL20-WL2m, WL30-WL3m and WL40-WL4m, and are selectively enabled with the block address decoded signals BL1–BL4. One of the row address decoder units 14a to 14d enabled with the block address decoded signal of the active level is responsive to the row address predecoded signals for energizing one of the word lines of the associated set in the standard mode. Thus, only one row address decoder unit consumes electric power in the standard mode, and the semiconductor static random access memory device decreases the power consumption.

The semiconductor static random access memory device further comprises an address buffer unit 16 coupled to address pins AY0 to AYj assigned to external address bits indicative of one of the column addresses, a column address decoder unit 17 coupled to the address buffer unit 16 and a sense amplifiers/column selector unit 18 coupled between the plurality of sets of digit line pairs DL10-DL1n, DL20-DL2n, DL30-DL3n and DL40-DL4n and a data bus BS.

The address buffer unit 16 produces column address predecoded signals from the external address bits, and supplies the column address predecoded signals to the column address decoder unit 17.

The column address decoder unit 17 is responsive to the column address predecoded signals for changing one of the column address decoded signals to an active level. The sense amplifiers/column selector unit 18 is controlled with the column address decoded signals, and transfers one of the digit line pair group to the data bus BS. The sense amplifiers develop the potential differences indicative of the read-out data bits.

The semiconductor static random access memory device further comprises signal buffer circuits 19a, 19b and 19c, and a chip enable signal CS, an output enable signal OE and a write enable signal WE are supplied to the signal buffer circuits 19a to 19c in the standard mode. The signal buffer circuit 19a produces an enable signal EBL11 from the chip enable signal CS of the active low level, and enables the address buffer units 13 and 16 and the other signal buffer circuits 19b and 19c. The signal buffer circuits 19b and 19c produce an enable signal EBL12 and an enable signal EBL13 from the output enable signal OE of the active low level and the write enable signal WE of the active low level in the standard mode.

Figure 8:
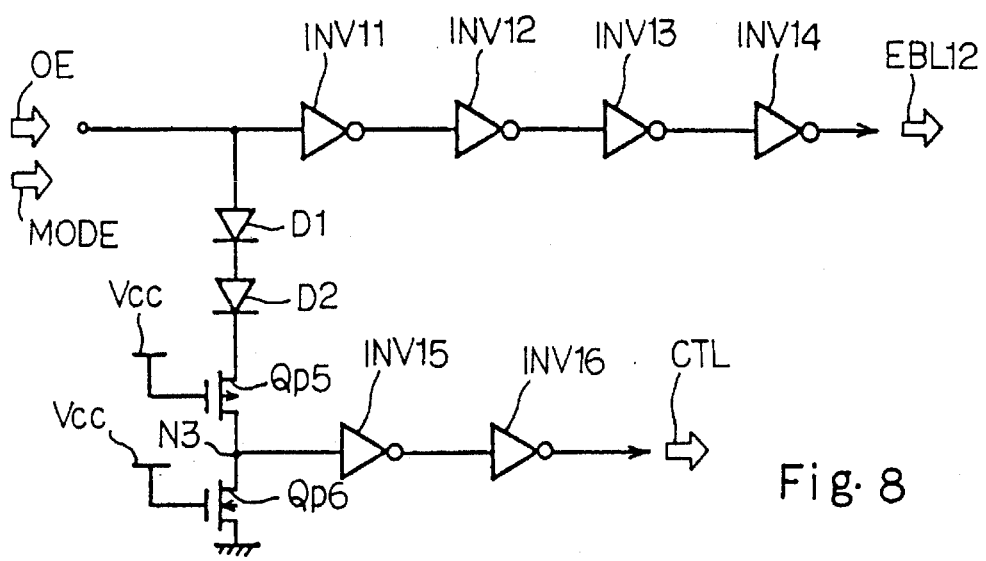
FIG. 8 is a logic diagram showing a signal buffer circuit for an output enable signal and a mode signal incorporated in the semiconductor static random access memory device.

The signal buffer circuit 19b further produces a control signal CTL from a mode control signal MODE in the testing mode. As will be shown in FIG. 8, the signal buffer circuit 19b comprises a series combination of inverters INV11, INV12, INV13 and INV14 for producing the enable signal EBL12, a complementary inverter Qp5 and Qn6, a series combination of diodes D1 and D2 coupled between the external signal pin and the complementary inverter Qp5 and Qp6 and a series combination of inverters INV15 and INV16 coupled to the common drain node N3 of the complementary inverter Qp5 and Qn6.

In the standard mode, the output enable signal OE is changed between the positive power voltage level Vcc and the ground voltage level, and the series combination of inverters INV11 to INV14 changes the enable signal EBL12 between the positive power voltage level Vcc and the ground voltage level. However, the positive power voltage level Vcc is stepped down through the diodes D1 and D2, and the p-channel enhancement type switching transistor Qp5 is turned off. For this reason, the n-channel enhancement type switching transistor Qn6 pulls down the common drain node N3, and the series combination of inverters INV15 and INV16 keeps the control signal CTL in the inactive low level.

While a diagnostic system 20 (see FIG. 6) is subjecting the semiconductor static random access memory device to the disturb test, the mode signal MODE is boosted over the positive power voltage level Vcc. The mode signal MODE is not lower than the positive power voltage level Vcc by the total of the threshold Vtp of the p-channel enhancement type switching transistor Qp5 and twice of the forward bias voltage Vf of the diode D1 or D2. Then, the p-channel enhancement type switching transistor Qp5 turns on, and the n-channel enhancement type switching transistor Qn6 turns off. As a result, the control signal CTL is changed to the active high level. The control signal CTL serves as a second enable signal.

Turning back to FIG. 6 of the drawings, the semiconductor static random access memory device further comprises an output data controller 23 coupled between the data bus BS and input and output data pins I/O1 to I/Ok, an input data controller 21 coupled between the data bus BS and the input and output data pins I/O1 to I/Ok and a multiple selecting circuit 22 associated with the block address decoder unit 15.

While the semiconductor static random access memory device is operating in the standard mode, the output data controller 23 and the input data controller 21 are selectively enabled with the enable signals EBL12 and EBL13. Namely, when the output data controller 23 is enabled with the enable signal EBL12, the output data controller 23 produces a multi-bit output data signal from the potential differences on the data bus BS, and the multi-bit output data signal is supplied to the data pins I/O1 to I/Ok. On the other hand, the input data controller 21 produces potential differences from a multi-bit input data signal at the data pins I/O1 to I/Ok, and the potential differences are supplied through the data bus BS to the sense amplifiers/column selector unit 18.

The multiple selecting circuit 22 is responsive to the control signal CTL for concurrently changing two block decoded signals to the active level. As shown in FIG. 7, the multiple selecting circuit 22 comprises two transfer gates TG1 and TG2 coupled between the inverter INV8 and the NOR gate NR2 and between the inverter INV1 and the NOR gate NR1 and two inverters INV15 and INV16 for producing the complementary control signal. In this instance, the transfer gate TG1 and the inverter INV5 and the transfer gate TG2 and the inverter INV6 respectively form transferring units. The output nodes of the inverters INV1 and INV8 serve as first intermediate nodes, and input nodes of the NOR gates NR1 and NR2 serve as second intermediate nodes.

While the control signal CTL is in the inactive low level in the standard mode, the transfer gates TG1 and TG2 are turned off, and the NOR gates NR1 and NR2 serve as inverters.

On the other hand, if the control signal CTL is changed to the high voltage level in the testing mode, the transfer gates TG1 and TG2 turn on, and the inverters INV8 and INV1 are electrically coupled to the NOR gates NR2 and NR1. For this reason, if the external address bits AX0 and AX1 selects the block address decoded signal B1 or B4, the block address decoder unit 15 changes the block address decoded signal B1 or B4 to the active high level, and the multiple selecting circuit 22 simultaneously changes the block address decoded signal B2 or B3. As a result, two of the row address decoder units 12a to 12d are simultaneously enabled, and become responsive to the row address predecoded signals. The diagnostic system 20 repeatedly executes the testing sequence shown in FIG. 3, and the static memory cells of the selected two sub-arrays are concurrently subjected to the disturb test. This results in that the disturb test is completed within a half of the time period consumed by the prior art static random access memory device.

Assuming now that two external address bits and two external address bits are indicative of the block address and the row address, the test sequence is repeated only four times as shown in FIG. 9. "True" and "complement" are representative of a word line assigned the row address and a word line assigned the complementary row address.

As will be appreciated from the foregoing description, the multiple selecting circuit 22 allows the block address decoder unit 15 to concurrently enable two of the row address decoder units 12a to 12d, and the memory cell sub-arrays asoicated with the selected row address decoder units are simultaneously subjected to the disturb test. As a result, the disturb test is accelerated, and is completed within a half of the time period consumed by the prior art device.

Second Embodiment

Figure 10:
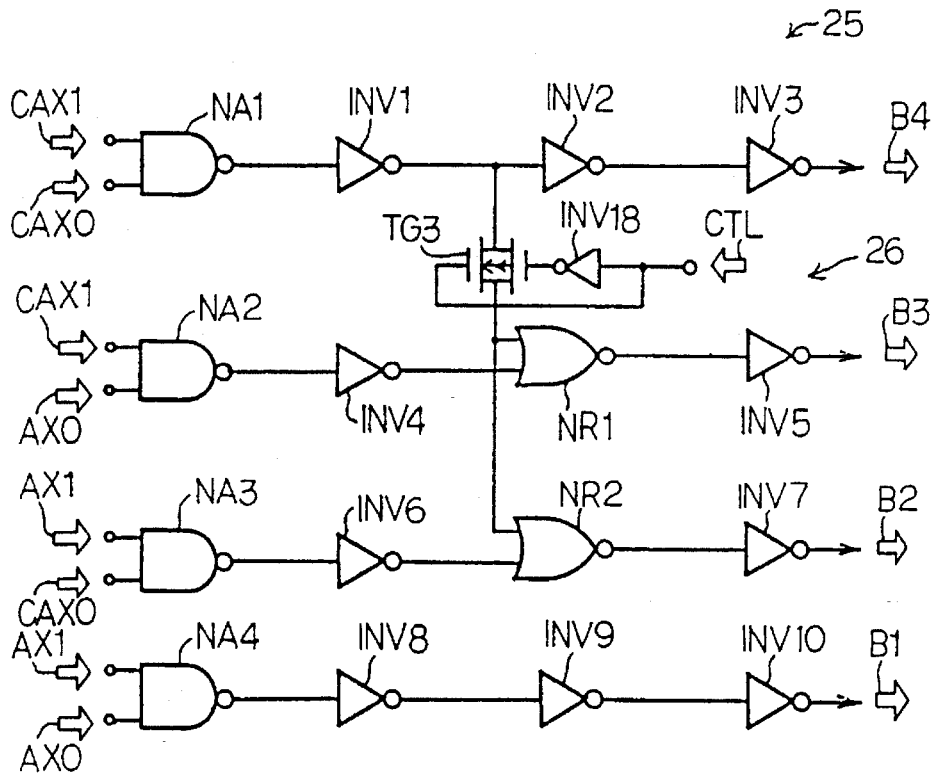
FIG. 10 is a logic diagram showing a signal buffer circuit for an output enable signal and a mode signal incorporated in another semiconductor static random access memory device according to the present invention.

Turning to FIG. 10 of the drawings, a block address decoder unit 25 is associated with a multiple selecting circuit 26. The block address decoder unit 25 and the multiple selecting circuit 26 form parts of a semicnductor static random access memory device according to the present invenion. Other component units and circuits of the second emboiment are similar to those of the first embodiment, and description is not made on those units and circuits for avoiding repetition.

The circuit configulation of the block adress decoder unit 25 is identical with that of the block addres decoder unit 15, and the circuit components are labeled with the same references designating corresponding components of the lock address ecoer unit 15 without detailed description.

The multiple selecting circuit 26 comprises an inverter INV18 for producing the complementary signal of the control signal CTL and a transfer gate TG3 coupled between the output node of the inverter INV1 and the NOR gates NR1 and NR2, and the transfer gate TG3 is controlled by the control signal CTL and the complementary signal.

If the diagnostic system supplies the block address indicative of the block adress decoded signal B4 to the block address decoder unit 25 in the disturb test, the three block address decoded signals B4, B3 and B2 are concurrently changed to the active level, and the assoicated three memory cell sub-arays are simultaneously subjected to the disturb test. As a result, the disturb test consumes shorter time period than that of the first embodient. Moreover, the multiple selecting circuit 26 is simpler than the multiple selecting circuit 22.

Third Embodiment

Figure 11:
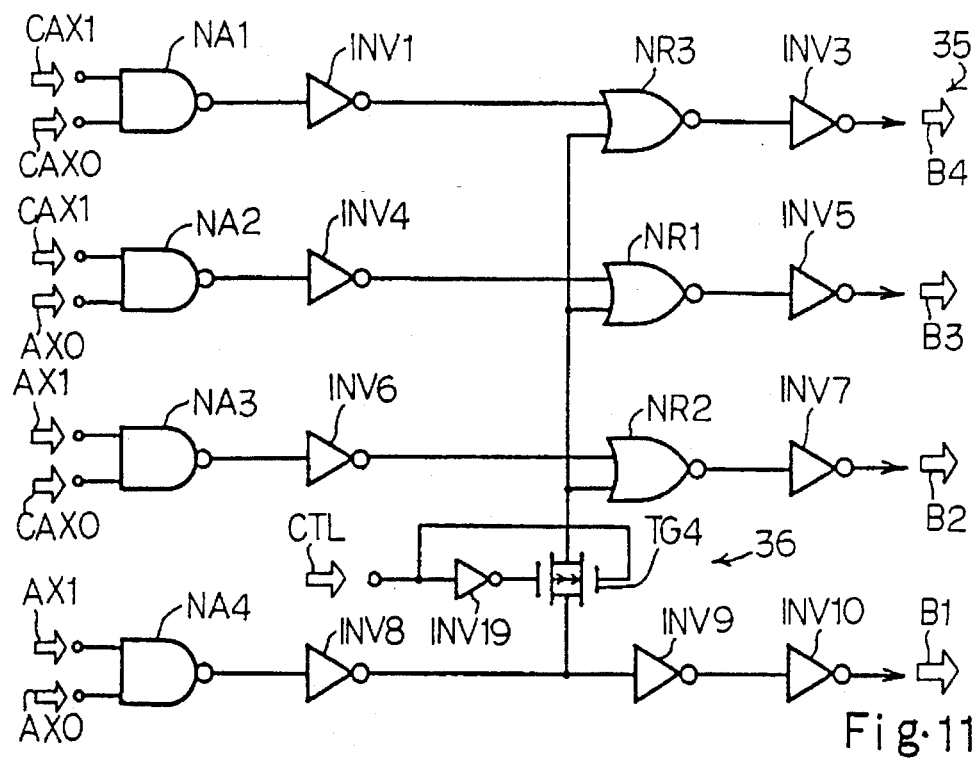
FIG. 11 is a logic diagram showing a signal buffer circuit for an output enable signal and a mode signal incorporated in yet another semiconductor static random access memory device according to the present invention.

Turning to FIG. 11 of the drawings, a block address decoder unit 35 is associated with a multiple selecting circuit 36. The block address decoder unit 35 and the multiple selecting circuit 36 form parts of a semiconductor static random access memory device embodying the present invenion. Other component units and circuits of the second emboiment are similar to those of the first embodiment, and no description is made on those units and circuits for avoiding repetition.

The circuit configuration of the block adress decoder unit 35 is similar to the block addres decoder unit 15 except for the inverter INV2 replaced with a NOR gate NR3, and the other circuit components are labeled with the same references designating corresponding components of the block address decoder unit 15 without detailed description.

The multiple selecting circuit 36 comprises an inverter INV19 for producing the complementary signal of the control signal CTL and a transfer gate TG4 coupled between the output node of the inverter INV8 and the NOR gates NR1, NR2 and NR3, and the transfer gate TG4 is controlled by the control signal CTL and the complementary signal.

If the diagnostic system supplies the block address indicative of the block adress decoded signal B1 in the disturb test, the four block address decoded signals B4, B3, B2 and B1 are concurrently changed to the active level, and the associated four memory cell sub-arrays 12a to 12d are simultaneously subjected to the disturb test. As a result, the disturb test consumes time period much shorter than that of the first embodiment. Moreover, the multiple selecting circuit 36 is simpler than the multiple selecting circuit 22.

Figure 1:
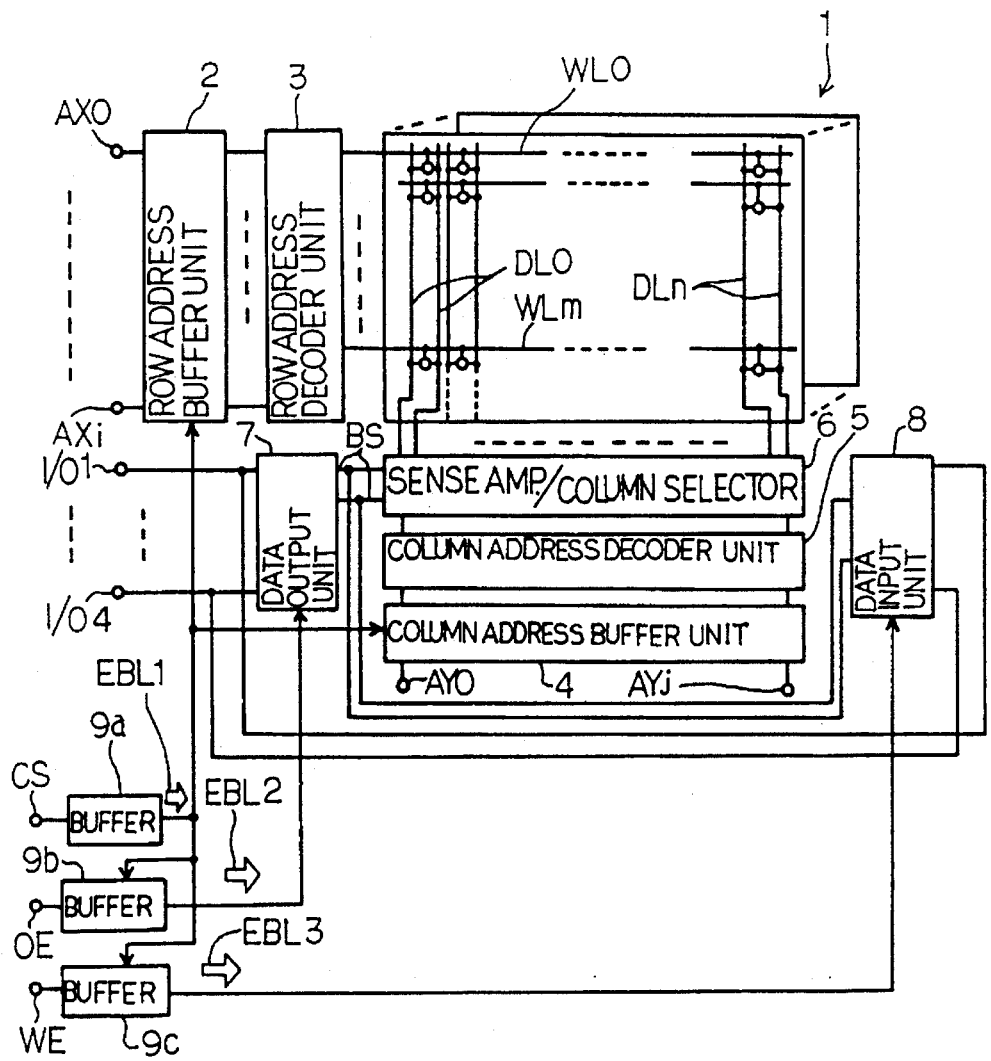
FIG. 1 is a block diagram showing the prior art dynamic random access memory device.
Figure 4:
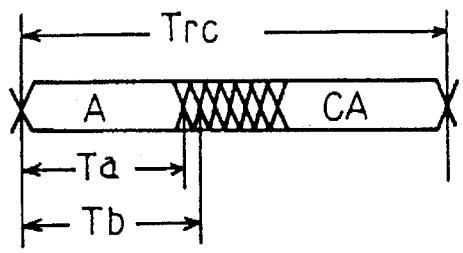
FIG. 4 is a view showing the relation between the read cycle time and the address modulation.
Figure 3:
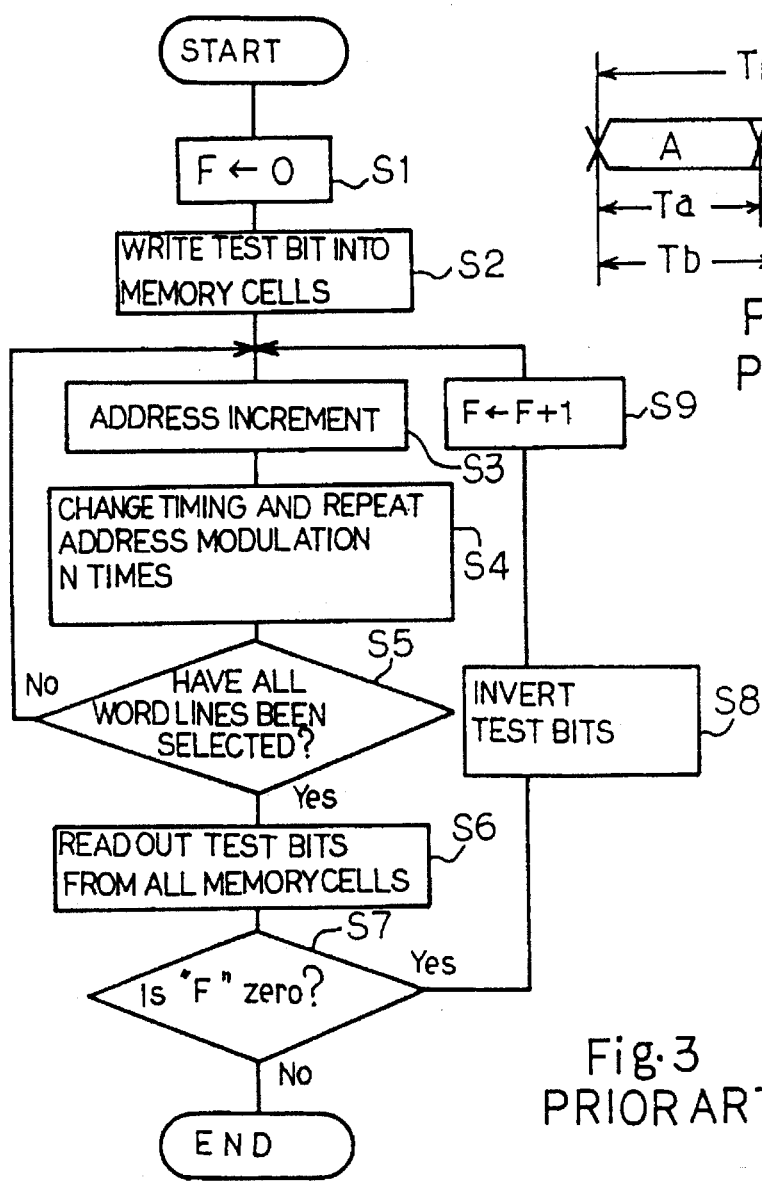
FIG. 3 is a flow chart showing the testing sequence of the disturb test.

If two external address bite and other two external address bits are indicative of a block address and a row address, the test sequence shown in FIG. 3 is repeated only twice as shown in FIG. 12.

As will be appreciated from the foregoing description, the multiple selecting circuit causes the block address decoder unit to simultaneously enable a plurality of memory cell sub-arrays for the disturb test, and the time period for the disturb test is drastically decreased.

Although particular embodiments of the present invention have been shown and described, it will be obvious to those skilled in the art that various changes and modifications may be made without departing from the spirit and scope of the present invention. For example, the number of memory cell sub-arrays, the number of digit line pairs of each group are changeable, and the circuit configuration of the static memory cell shown in FIG. 2 does not limit the semiconductor static random access memory device according to the present invention.

Moreover, the semiconductor static random access memory device may form a part of a large scale-integration together with other function blocks.

Finally, the control signal CTL may be produced by other signal buffer circuit assigned to the chip select signal CS or the write enable signal, and a signal pin exclusively used for the mode signal may be provided for the multiple selecting circuit.

What is claimed is:

1. A semiconductor static random access memory device having a standard mode and a testing mode, comprising:

a) a memory cell array split into a plurality of memory cell sub-arrays each implemented by a plurality of addressable memory cells;

b) a plurality of sets of word lines respectively associated with said plurality of memory cell sub-arrays, the word lines of each set being selectively coupled to said addressable memory cells of the associated memory cell sub-array for making selected memory cells accessible;

c) a plurality of sets of digit line pairs respectively associated with said plurality of memory cell sub-arrays, the digit line pairs of each set being selectively coupled to said memory cells of the associated memory cell sub-array for propagating data bits in the form of potential difference from and to the selected memory cells;

d) a plurality of row address decoder units respectively associated with said plurality of sets of word lines, and each responsive to a first enable signal for energizing one of the word lines of the associated set specified by external row address bits;

e) a controlling means which inputs a standard external control signal in said standard mode and an external control signal in said testing mode, wherein said external control signal has a first voltage level outside of a voltage range of said standard external control signal and wherein said controlling means is responsive to said external control signal in said first voltage level for producing a second enable signal;

f) a block address decoder unit coupled to said plurality of row address decoder units, responsive to external block address bits for supplying said first enable signal to one of said plurality of row address decoder units in said standard mode; and g) a multiple selecting circuit connected to said block address decoder unit and said controlling means, wherein said multiple selecting circuit inputs said second enable signal from said controlling means, and causes said block address decoder unit to supply said first enable signal to more than one row address decoder units for a disturb test in said testing mode when said multiple selecting circuit is enabled with said second enable signal.

2. The semiconductor static random access memory device as set forth in claim 1, in which said block address decoder unit comprises a plurality of first logic gates selectively supplied with block address predecoded signals produced from said external block address bits, and a plurality of series circuits of second logic gates respectively coupled to output nodes of said respective first logic gates for producing block address decoded signals serving as said first enable signal, said multiple selecting circuit comprising a plurality of transferring units each having a transfer gate controlled by said second enable signal and having a first node coupled to a first intermediate node of one of said plurality of series circuits of second logic gates and a second node coupled to a second intermediate node of another of said plurality of series circuits of second logic gates.

3. The semiconductor static random access memory device as set forth in claim 1, in which said block address decoder unit comprises a plurality of-first logic gates selectively supplied with block address predecoded signals produced from said external block address bits, and a plurality of series circuits of second logic gates respectively coupled to output nodes of said respective first logic gates for producing block address decoded signals serving as said first enable signal, said multiple selecting circuit comprising a transfer gate controlled by said second enable signal and having a first node coupled to a first intermediate node of one of said plurality of series circuits of second logic gates and a second node coupled to second intermediate nodes of others of said plurality of series circuits of second logic gates.

4. The semiconductor static random access memory device as set forth in claim 1, in which said controlling means shares a signal pin with a signal buffer circuit for producing an internal control signal from said external control signal, wherein said external control signal changes the voltage level on said signal pin to said first voltage level which is a voltage level outside of said voltage range of said standard external control signal.

5. The semiconductor static random access memory device as set forth in claim 4, in which said controlling means comprises a series of diodes electrically coupled to said signal pin for stepping down said external control signal, and a complementary inverter coupled between said series of diodes and a constant voltage source and selectively coupling said series of diodes and said constant voltage source to an output node thereof depending upon the voltage level at a node between said series of diodes and said complementary inverter, said second enable signal being produced at said output node.

6. A semiconductor static random access memory device having a standard mode for a read-out sequence and a writein sequence and a testing mode for at least a disturb test, comprising:

a) a memory cell array split into a plurality of memory cell sub-arrays each implemented by a plurality of addressable memory cells;

b) a plurality of sets of word lines respectively associated with said plurality of memory cell sub-arrays, the word lines of each set being selectively coupled to said addressable memory cells of the associated memory cell sub-array for making selected memory cells accessible;

c) a plurality of sets of digit line pairs respectively associated with said plurality of memory cell sub-arrays, the digit line pairs of each set being selectively coupled to said memory cells of the associated memory cell subarray for propagating data bits from and to the selected memory cells;

d) a plurality of row address decoder units respectively associated with said plurality of sets of word lines, and each responsive to a first enable signal for energizing one of the word lines of the associated set specified by external row address bits;

e) a column address decoder for producing column address decoded signals from external column address bits;

f) a combined circuit of sense amplifiers and column selector coupled between said plurality of sets of digit line pairs and a data bus, and responsive to said column address decoded signals for selectively coupling said plurality of sets of digit line pairs to said data bus;

g) a read and write circuit coupled between said data bus and data pins for producing an output data signal from potential differences on said data bus in said read-out sequence and potential differences from an input data signal in said write-in sequence;

h) a signal buffer circuit coupled to a control signal pin and said read and write circuit for producing an internal control signal used in one of said read-out sequence and said write-in sequence from an external control signal;

i) a controlling means coupled to said control signal pin and responsive to a mode control signal supplied to said control signal pin for producing a second enable signal, said mode control signal being higher in voltage level than said external control signal;

j) a block address decoder unit coupled to said plurality of row address decoder units, responsive to external block address bits for supplying said first enable signal to one of said plurality of row address decoder units in said standard mode; and k) a multiple selecting circuit connected to said block address decoder unit and said controlling means, wherein said multiple selecting circuit inputs said second enable signal from said controlling means, and causes said block address decoder unit to supply said first enable signal to more than one row address decoder units for said disturb test in said testing mode when said multiple selecting circuit is enabled with said second enable signal.

* * * * *

UNITED STATES PATENT AND TRADEMARK OFFICE
CERTIFICATE OF CORRECTION

PATENT NO. : 5,483,488  
DATED : January 9, 1996  
INVENTOR(S) : Kohji Sanada

Page 1 of 2

It is certified that error appears in the above-indentified patent and that said Letters Patent is hereby corrected as shown below:

Col. 1, line 55, delete "deference", insert --difference--.
Col. 10, line 21, delete "asoicated", insert --associated--.
Col. 10, line 31, delete "semicnductor", insert --semiconductor--.
Col. 10, line 33, delete "invenion", insert --invention--.
Col. 10, line 34, delete "emboiment", insert --embodiment--.
Col. 10, line 37, delete "configulation", insert --configuration--.
Col. 10, line 37, delete "adress", insert --address--.
Col. 10, line 38, delete "adress", insert --address--.
Col. 10, line 41, delete "ecoer", insert --decoder--.
Col. 10, line 49, delete "adress", insert --address--.
Col. 10, line 53, delete "assoicated", insert --associated--.
Col. 10, line 55, delete "embodient", insert --embodiment--.
Col. 10, line 65 and 66, delete "invenion", insert --invention--.
Col. 10, line 67, delete "emboiment", insert --embodiment--.
Col. 11, line 3, delete "adress", insert --address--.
Col. 11, line 4, delete "addres", insert --address--.
Col. 11, line 16, delete "adress", insert --address--.
Col. 13, line 24, delete "writein", insert --write-in--.

UNITED STATES PATENT AND TRADEMARK OFFICE
CERTIFICATE OF CORRECTION

PATENT NO. : 5,483,488
DATED : January 9, 1996
INVENTOR(S) : Kohji Sanada

It is certified that error appears in the above-indentified patent and that said Letters Patent is hereby corrected as shown below:

Col. 13, line 40, delete "subarray", insert --sub-array--.

Signed and Sealed this

Thirtieth Day of July, 1996

Attest:

BRUCE LEHMAN

Attesting Officer     Commissioner of Patents and Trademarks